(12) United States Patent
Beutner et al.

(10) Patent No.: US 8,759,755 B2
(45) Date of Patent: Jun. 24, 2014

(54) APPARATUS FOR COUNTING IONS, AND METHOD FOR COUNTING IONS

(75) Inventors: Sven Beutner, Frankfurt am Main (DE); Michael Kloeppel-Riech, Friedberg (DE)

(73) Assignee: Braun GmbH, Kronberg (DE)

( * ) Notice: Subject to any disclaimer, the term of this patent is extended or adjusted under 35 U.S.C. 154(b) by 205 days.

(21) Appl. No.: 13/433,324

(22) Filed: Mar. 29, 2012

(65) Prior Publication Data
US 2012/0305794 A1    Dec. 6, 2012

(30) Foreign Application Priority Data

May 31, 2011    (EP) .................................... 11004435

(51) Int. Cl.
*G01T 1/18* (2006.01)
*A45D 20/00* (2006.01)

(52) U.S. Cl.
USPC .............................................. 250/283; 34/97

(58) Field of Classification Search
USPC ........................... 250/283, 336.1, 489; 34/97
See application file for complete search history.

(56) References Cited

U.S. PATENT DOCUMENTS

| | | | |
|---|---|---|---|
| 4,632,135 A | 12/1986 | Lenting et al. | |
| 5,975,090 A | 11/1999 | Taylor et al. | |
| 6,152,146 A | 11/2000 | Taylor et al. | |
| 6,393,718 B1 | 5/2002 | Harris et al. | |
| 6,640,049 B1 | 10/2003 | Lee et al. | |
| 6,763,606 B2 | 7/2004 | Saida | |
| 6,986,212 B2 | 1/2006 | Saida et al. | |
| 6,996,916 B2 | 2/2006 | Cafaro | |
| 7,047,660 B2 | 5/2006 | Leventhal | |
| 7,291,603 B2 | 11/2007 | Wilde et al. | |
| 2004/0129288 A1 | 7/2004 | Saida et al. | |
| 2005/0016559 A1 | 1/2005 | Saida | |
| 2005/0172979 A1 | 8/2005 | Saida et al. | |
| 2007/0085036 A1 | 4/2007 | Santhouse | |

FOREIGN PATENT DOCUMENTS

| | | |
|---|---|---|
| JP | 2002/005975 A | 1/2002 |
| JP | 2002-065344 | 3/2002 |
| JP | 2002-219355 | 8/2002 |
| JP | 2003-061736 | 3/2003 |
| JP | 2003-070526 | 3/2003 |
| JP | 2003-135151 | 5/2003 |

(Continued)

OTHER PUBLICATIONS

Matsui M et al: "Improvement of the Transfer Efficiency of the Atomized Powder Coating System by Increasing the Conveying Air Speed", IEEE Transaction on Industry Applications, IEEE Service Center, Piscataway, NJ, vol. IA-22, No. 2, Mar. 1, 2009, pp. 606-614.

(Continued)

*Primary Examiner* — Mark R Gaworecki
(74) *Attorney, Agent, or Firm* — Jeffrey V Bamber; Kim W Zerby

(57) ABSTRACT

An apparatus for counting the number of ions emitted by an ion source of a handheld domestic appliance is disclosed. The apparatus includes a collector housing for collecting ions impinging on the inner surface of the collector housing and a determining means coupled with the collector housing for determining the number of ions collected by the collector housing. The collector housing has an input opening dimensioned such that the domestic appliance is at least partially insertable into the collector housing via input opening. A method for counting the number of ions emitted by an ion source of a handheld domestic appliance is also disclosed.

14 Claims, 4 Drawing Sheets

(56) References Cited

FOREIGN PATENT DOCUMENTS

| JP | 2003-159114 | 6/2003 |
|---|---|---|
| JP | 2003-199628 | 7/2003 |
| JP | 2003-275011 | 9/2003 |
| JP | 2003-275013 | 9/2003 |
| JP | 2004-008669 | 1/2004 |
| JP | 2004-041759 | 2/2004 |
| JP | 2004-055351 | 2/2004 |
| JP | 2004-166932 | 6/2004 |
| JP | 2004-208770 | 7/2004 |
| JP | 2004-254897 | 9/2004 |
| JP | 2004-261610 | 9/2004 |
| JP | 2004-344354 | 12/2004 |
| JP | 2005-095638 | 4/2005 |
| JP | 2005-168622 | 6/2005 |
| JP | 2015-198984 | 7/2005 |
| JP | 2005-349139 | 12/2005 |
| JP | 2006-175028 | 7/2006 |
| WO | WO 2010/013614 A1 | 2/2010 |

OTHER PUBLICATIONS

Kucerovsky Z et al: "Attrition of the Charge on a Carrier Moving Through a Gas", IEEE Transactions on Industry Application, IEEE Service Center, Piscataway, NJ, vol. 43, No. 6, Nov. 1, 2007, pp. 1515-1523.

Kawaguchi T et al: "A Magnetically Levitated Electrode Ionization Chamber of the Noncontact Measurement Type", Nuclear Instruments & Methods in Physics Research, Section—A: Accelerators, Spectrometers, Detectors and Associated Equipment, Elsevier, Amsterdam, NL, vol. 481, No. 1-3, Apr. 1, 2002, pp. 317-322.

European Search Report dated Nov. 2, 2011, 10 pages.

APPARATUS FOR COUNTING IONS, AND METHOD FOR COUNTING IONS

FIELD OF THE INVENTION

The present invention relates to an apparatus for counting the number of ions emitted by an ion source of a handheld domestic appliance comprising a collector housing for collecting ions impinging on the inner surface of the collector housing and determining means being coupled with the collector housing in order to determine the number of ions collected by the collector housing, said collector housing having an input opening. The present invention further relates to a method for counting the number of ions emitted by an ion source of a handheld domestic appliance.

BACKGROUND OF THE INVENTION

According to the state of the art it is known to provide domestic appliances, especially hair care devices, comprising an ion source for emitting ions. Recently, hair care devices, e.g. hairdryers, hairbrushes or curling irons, having the function to expel ionized particles, i.e. negatively ionized air or positively ionized air, have enjoyed increasing popularity. These devices make it possible to obtain the effect of treating the hair, making it more manageable and giving it more body, by expelling towards the hair the negatively or positively ionized air while drying, brushing or curling the hair.

It is further known to provide apparatuses, which are able to count ions emitted by an ion source. Usually, such apparatuses count the number of ions and measure the concentration of ions, respectively, in a gas medium by means of electric current detection with an electrometer or another current detecting device. Such apparatuses usually comprise a so-called Faraday cup being made of a conductive material and having a relatively small input opening. In order to count the ions, the Faraday cup is positioned such that a narrow ion beam, which may for example be expelled by a directional ion source, enters the cup via the input opening. Alternatively, air of the environment could be sucked through the input opening, so that the ions in the surrounding gas medium are sucked into the Faraday cup as well. Inside the Faraday cup the ions, which carry an electric charge, impinge on its inner surface such that a current could be measured by means of the electrometer which is coupled with the Faraday cup. The measured current is directly proportional to the number of ions and number of charges per ion, such that it could be used to determine the number of ions emitted by an ion source and collected by the Faraday cup.

The known apparatuses for counting the number of ions emitted by an ion source have proved themselves insofar as the number of ions emitted by a directional ion source could be reliably determined by leading the ion beam of a directional ion source directly through the input opening into the Faraday cup. However, it has been found out that the result of the measurement is less accurate if the ions are emitted by a non-directional ion source and have to be taken up through the input opening by sucking the environmental air of the non-directional ion source through the input opening.

It is therefore an object of the present invention to provide an apparatus for counting the number of ions emitted by an ion source of a handheld domestic appliance permitting an accurate and reliable counting of the emitted ions independent of the type of ion source. It is a further object of the present invention to provide a method for counting the number of ions emitted by an ion source of a handheld domestic appliance permitting an accurate and reliable counting of the emitted ions independent of the type of ion source. Above this, it is an object of the present invention to provide an advantageous use of the apparatus and the method according to the invention.

SUMMARY OF THE INVENTION

The present invention is directed to an apparatus for counting the number of ions emitted by an ion source of a handheld domestic appliance. The handheld domestic appliance may for example be a hair care device, like a hairdryer, a hairbrush or a curling iron. The apparatus comprises a collector housing for collecting ions impinging on the inner surface of the collector housing. The collector housing may for example be a well-known Faraday cup. Further, there are provided determining means being coupled with the collector housing in order to determine the number of ions collected by the collector housing. The determining means are preferably composed of an electrometer, however, also other current detecting means could be used. The collector housing further has an input opening. The input opening is dimensioned such that the domestic appliance is at least partially, preferably completely, insertable into the collector housing via input opening.

While the input opening in the Faraday cup of apparatuses according to the state of the art is very small, so that only the ions of the environment may be lead into the Faraday cup via the input opening, the input opening in the collector housing according to the invention is enlarged to such an extent that the domestic appliance with its ion source could at least partially, preferably completely, inserted into the collector housing via input opening. Thus, the apparatus according to the invention permits an accurate and reliable counting of the ions emitted by the domestic appliance independent of the type of ion source, i.e. it doesn't matter if the ion source is a directional ion source or a non-directional ion source.

In one embodiment of the apparatus according to the invention the input opening has a width and a height of at least 8 cm. An input opening of such a width and height is big enough to insert many of the known domestic appliances, especially many of the known hair care devices, into the collector housing via the input opening. In order to increase the number of domestic appliances which could be tested by the apparatus, the input opening preferably has a width and a height of at least 12 cm. More preferably the input opening has a width and a height of at least 16 cm, so that the apparatus could be used for most of the common hair care devices. It has further been found out, that the best measurement results are achieved, if the input opening is circular, so that the aforementioned minimum sizes could be regarded as the diameter of the input opening in this preferred embodiment.

In a further embodiment of the apparatus according to the invention the collector housing surrounds a chamber, i.e. a chamber in which the domestic appliance is at least partially arranged during measuring. The chamber preferably has a length of at least 35 cm in its feeding direction, so that many of the known domestic appliances, especially many of the known hair care devices, could be completely inserted into the chamber of the collector housing. The feeding direction is the direction in which the domestic appliance is fed or moved during the insertion of the domestic appliance through the input opening into the chamber. The length of the chamber in feeding direction is preferably at least 45 cm in order to increase the number of domestic appliances which could be completely inserted into the chamber. More preferably the length of the chamber in feeding direction is at least 55 cm, so that most of the common hair care devices could be completely inserted into the chamber, thereby increasing the accuracy of the measuring.

In an useful embodiment of the apparatus according to the invention the collector housing is arranged within an outer housing, the outer housing being grounded and the collector housing being separated from the outer housing by insulating means. The outer housing serves to shield the collector housing from external influences, especially ions in the environmental air could be absorbed by the outer housing so that they could not impinge on the surface of the collector housing where they would influence the measurement results.

In a further embodiment of the apparatus according to the invention the collector housing is arranged within an additional housing, the additional housing being grounded and placed within the outer housing, the collector housing as well as the outer housing being separated from the additional housing by insulating means. It has been found out that by providing the additional housing the shielding of the collector housing from external influences could be enhanced so that environmental aspects do no longer have an influence on the measurement results. Thus, this embodiment of the apparatus permits an accurate and reliable counting of the ions emitted by the ion source of the domestic appliance inside the collector housing. In this embodiment it is further useful that the additional housing can be grounded to the reference ground of the determining means. Due to the fact, that the additional housing is protected against environmental influences by the outer housing as well, it can serve as a reasonable reference for the measurement carried out by the determining means. Thus, this embodiment of the apparatus permits a very accurate counting of the ions. Further, it is preferred if the outer housing and the additional housing are grounded via separate conductors, since the accuracy of the measurement could be further enhanced by implementing this action.

In a yet further embodiment of the apparatus according to the invention the conductor via which the outer housing is grounded, the conductor via which the additional housing is grounded and a conductor connecting the collector housing with the determining means form a triaxial cable, the conductor leading to the determining means forming the inner conductor, the conductor grounding the additional housing forming the inner tubular conductor and the conductor grounding the outer housing forming the outer tubular conductor of the triaxial cable. With this embodiment an extremely accurate measuring could be carried out, while environmental influences essentially do not play a role.

Basically, the collector housing as well as the other mentioned housings of the apparatus according to the invention should be made of highly conductive materials, e.g. of metals. In a further advantageous embodiment of the apparatus according to the invention the collector housing and the additional housing are made of copper, in order to achieve an accurate counting of ions impinging on the surface of the collector housing on the one hand and an enhanced shielding of the collector housing by way of the additional housing on the other hand. It has further been found out that the aforementioned shielding effect accomplished by combining the outer housing with the additional housing is further enhanced, if the outer housing is made of aluminium.

In a further embodiment of the apparatus according to the invention the outer housing and—if an additional housing is provided—the additional housing has an opening, the opening or openings being aligned with the input opening of the collector housing. This way the domestic appliance and hair care device, respectively, could be easily inserted into the collector housing via the opening or openings and the input opening. It is preferred, if the opening in the outer housing or/and the additional housing is smaller than the input opening of the collector housing, so that a further enhanced shielding of the collector housing by way of the outer or/and additional housing could be achieved, said enhanced shielding leading to accurate and reliable measurement results. The opening in the outer housing or/and additional housing more preferably has a width and a height of at least 8 cm, preferably at least 12 cm, more preferably at least 16 cm, so that common domestic appliances and hair care devices, respectively, could completely or at least partially be inserted via the opening or openings as already described before.

By providing a relative large input opening in the collector housing and a relative large opening in the outer or/and additional housing, it is possible to insert the domestic appliance into the collector housing, however, there is a risk that ions in the environmental air may enter the collector housing and impinge on its inner surface, thereby influencing the measurement results. In order to avoid this influence, in a further preferred embodiment of the apparatus according to the invention there is provided a cover for altering the size of the opening of the outer housing or/and additional housing. Thus, after inserting the domestic appliance through the opening in the outer or/and additional housing and the input opening into the collector housing, the size of the opening could be decreased in order to prevent ions in the environmental air from entering the collector housing during measuring. In this embodiment it is further preferred if the cover is an iris diaphragm, so that a uniform downsizing of the opening could be achieved.

In a further embodiment of the apparatus according to the invention a projection of the opening in the outer housing or/and additional housing in the feeding direction is completely arranged within a projection of the input opening in the feeding direction. In this way an excellent shielding of the collector housing by way of the outer housing or/and additional housing even in the border area of the input opening is achieved.

Some of the domestic appliances and hair care devices, respectively, do not only expel ions but also generate heat or discharge heated air. This is for example the case, if the domestic appliance is a curling iron or a hair dryer. In such cases, the measurement result is negatively influenced by the heated air retained inside the collector housing. In order to eliminate this interference factor the collector housing further comprises an outlet opening for releasing air from the inside of the collector housing to the environment of the apparatus in a further useful embodiment of the apparatus according to the invention.

According to a further embodiment of the invention the outlet opening is smaller than the input opening so that an escape of ions emitted by the ion source of the domestic appliance through the outlet opening is widely avoided. Alternatively or additionally the outlet opening is separated from the input opening. This is especially helpful, if a cover for altering the size of the opening in the outer housing or/and additional housing is provided. Alternatively or additionally the outlet opening is disposed on the opposite side of the input opening.

In a further embodiment of the apparatus according to the invention the outlet opening is covered with an electroconductive mesh which is connected to the collector housing for collecting ions. Thus, the air inside the collector housing may be discharged to the environment via the gaps in the mesh, but the ions expelled by the handheld domestic appliance may be collected by the mesh so that in spite of the outlet opening an accurate and reliable counting of the ions emitted by the domestic appliance is possible.

In a further embodiment of the apparatus according to the invention the wall of the outer housing or/and the additional housing comprises an opening for leading the air from the outlet opening of the collector housing to the environment of the apparatus. It is preferred, if the opening in the wall of the outer housing or/and the additional housing is aligned with the outlet opening of the collector housing. The opening in the wall of the outer housing or/and the additional housing is preferably covered with an electroconductive mesh being connected to the wall of the respective outer or additional housing, said meshes serving to protect the collector housing from external influences.

Due to the fact, that the collector housing and the determining means connected thereto are interference-prone components of the apparatus, a contact or a collision between the collector housing and the domestic appliance to be inserted into the collector housing should implicitly be avoided. Therefore, in a further useful embodiment of the apparatus according to the invention a feeding system for feeding the domestic appliance into the collector housing is provided, reducing the risk of a contact or collision between the domestic appliance and the collector housing. In this embodiment, it is preferred if the domestic appliance may be fed by a translational movement, more preferably by an exclusive translational motion. The feeding system preferably comprises a movable carrier for carrying the domestic appliance. The carrier more preferably comprises fixing means for immobilizing the domestic appliance with respect to the carrier. By immobilizing the domestic appliance with respect to the carrier a contact between the collector housing and the domestic appliance—especially during the movement of the carrier—is reliably prevented.

The present invention is further directed to a method for counting the number of ions emitted by an ion source of a handheld domestic appliance. The method according to the invention comprises the following procedural steps. First, an apparatus according to the invention as described before is provided. Afterwards, the domestic appliance is completely or at least partially inserted into the collector housing of the apparatus. Then, the number of ions impinging on the inner surface of the collector housing is determined. The aforedescribed advantages of the apparatus according to the invention apply accordingly to the method according to the invention, so that it is referred to the description above. The method according to the invention especially permits an accurate and reliable counting of the emitted ions independent of the type of ion source, i.e. even if the ion source is a non-directional ion source.

In one embodiment of the method according to the invention the opening of the outer housing or/and additional housing is completely or at least partially covered in order to alter the size of the opening after the domestic appliance has been inserted into the collector housing, thereby preventing ions in the environmental air from entering the collector housing during measuring. Thus, the measuring leads to an accurate and reliable result.

In a further embodiment of the method according to the invention air from the inside of the collector housing is released to the environment of the apparatus, preferably by means of an outlet opening in the collector housing, said outlet opening more preferably being separated from the input opening. This embodiment of the method according to the invention is especially be useful, if the domestic appliances and hair care devices, respectively, also generate heat or discharge heated air. This is for example the case, if the domestic appliance is a curling iron or a hair dryer. By releasing the heated air from the inside of the collector housing, the interference factor of heated air retained inside the collector housing is eliminated. The outlet opening is preferably covered with an electroconductive mesh connected to the collector housing for collecting ions, so that a loss of ions leaving the collector housing through the outlet opening could be avoided while the air may leave the collector housing.

The present invention is further directed to a use of the apparatus according to the invention or the method according to the invention for counting the number of ions emitted by an ion source of a handheld domestic appliance, said ion source being a non-directional ion source, said handheld domestic appliance preferably being a hair care device, more preferably a hairdryer, a hairbrush or a curling iron.

BRIEF DESCRIPTION OF THE DRAWINGS

A preferred embodiment of the present invention will now be described, by way of example only, with reference to the drawings in which.

DETAILED DESCRIPTION OF THE INVENTION

Figure 1:
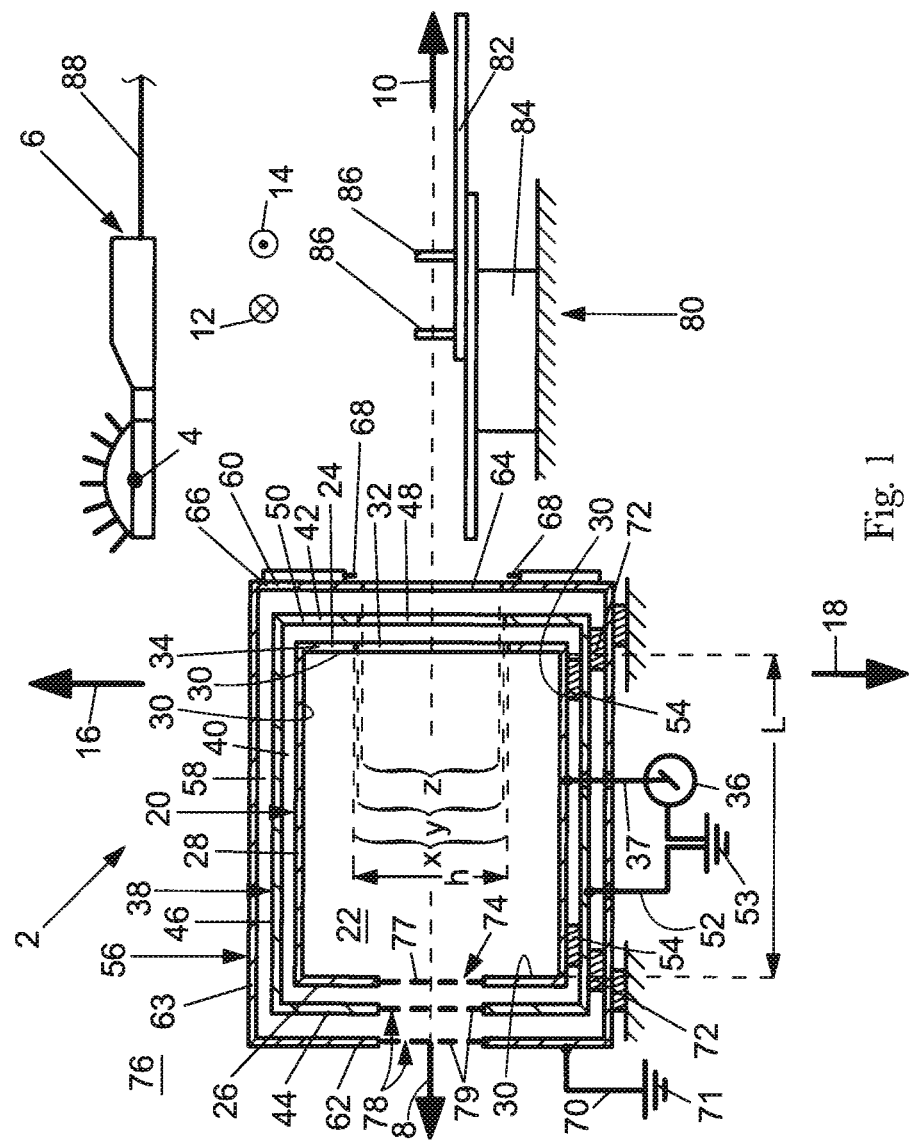
FIG. 1 shows a schematic and partially cross-sectional side-view of an embodiment of the apparatus according to the invention before the domestic appliance is fixed to the feeding system.

FIG. 1 shows a schematic and partially cross-sectional side-view of an embodiment of the apparatus 2 for counting the number of ions emitted by an ion source 4 of a handheld domestic appliance 6. While the domestic appliance 6 will be described later, in FIG. 1 the opposing longitudinal directions 8, 10, the opposing lateral directions 12, 14 and the opposing vertical directions 16, 18 of the apparatus 2 are indicated by corresponding arrows. The longitudinal direction 8 is further called the feeding direction of the apparatus 2.

The apparatus 2 comprises a collector housing 20, which is made of copper. The collector housing 20 surrounds a chamber 22, said chamber 22 preferably being a cylindrical chamber. The chamber 22 is limited in the longitudinal direction 10 by a front wall 24, in the longitudinal or feeding direction 8 by a back wall 26 and in the lateral and vertical directions 12, 14, 16, 18 by a tubular side wall 28 of the collector housing 28. Said walls 24, 26, 28 comprise an inner surface 30 facing the chamber 22. The chamber 22 has a length L in the longitudinal direction 8, 10, said length L at least being 35 cm. Preferably the chamber has a length L of at least 45 cm, more preferably at least 55 cm, so that most of the common domestic appliances 6, especially hair care devices, could be completely inserted into the chamber 22.

In the front wall 24 of the collector housing 20 there is provided an input opening 32, said input opening 32 being dimensioned such that the domestic appliance 6 could at least partially, preferably completely, inserted into the collector housing 28 in the longitudinal or feeding direction 8 via input opening 32 as will be described later. In order to achieve this, the width in the lateral direction 12, 14 and the height h in the vertical direction 16, 18 of the input opening 32 is at least 8 cm. In FIG. 1 only the height h of input opening 32 is indicated due to the fact that in the shown embodiment the input opening 32 is circular, so that the height h could also be regarded as the width or diameter of the input opening 32. An input opening 32 of such a width and height h is big enough to insert many of the known domestic appliances 6, especially many of the known hair care devices, in the feeding direction 8 into the collector housing 20 via the input opening 32. In order to increase the number of domestic appliances 6 which could be tested by the apparatus 2, the input opening 32 preferably has a width and a height h of at least 12 cm. More preferably the input opening 32 has a width and a height h of at least 16 cm, so that the apparatus 2 could be used for most of the common domestic appliances 6 and hair care devices, respectively. Further, the input opening 32 is provided in the front wall 24 such that a collar 34 of the front wall 24 is left, which surrounds the input opening 32. It has been found out that such a collar 34 helps to increase the accuracy of the measuring.

The collector housing 20 is electrically coupled with determining means 36 via conductor 37. The determining means 36 serve to determine the number of ions collected by the collector housing and impinging on the inner surface 30 of the collector housing 20, respectively. The determining means 36 are preferably composed of an electrometer, however, also other current detecting means could be used.

The apparatus 2 further comprises an additional housing 38, which is also made of copper. The additional housing surrounds a second chamber 40 in which the collector housing 28 is arranged, i.e. the collector housing 20 is arranged within the additional housing 38. The second chamber 40 is limited in the longitudinal direction 10 by a front wall 42, in the longitudinal or feeding direction 8 by a back wall 44 and in the lateral and vertical directions 12, 14, 16, 18 by a surrounding side wall 46 of the additional housing 38.

In the front wall 42 of the additional housing 38 there is provided an opening 48, said opening 48 being dimensioned such that the domestic appliance 6 could at least partially, preferably completely, inserted into the collector housing 20 in the longitudinal or feeding direction 8 via opening 48 and input opening 32 as will be described later. In order to achieve this, the width in the lateral direction 12, 14 and the height in the vertical direction 16, 18 of the opening 48 is at least 8 cm, preferably at least 12 cm, more preferably at least 16 cm. The opening 48 is also circular and provided in the front wall 42 such that a collar 50 of the front wall 42 is left, which surrounds the opening 48.

The opening 48 is aligned with the input opening 32 in the longitudinal or feeding direction 8 and has a smaller size, i.e. height and width of the opening 48 and/or the diameter of the opening 48 is smaller than the height h and width of the input opening 32 and/or the diameter of the input opening 32. Further, a projection y of the opening 48 in the longitudinal or feeding direction 8 is completely arranged within a projection x of the input opening 32 in the longitudinal or feeding direction 8, as indicated in FIG. 1.

The additional housing 38 is grounded by way of a first conductor 52 to the reference ground 53 of the determining means 35. Further, there are provided insulating means 54 to avoid direct contact between the collector housing 20 and the additional housing 38 and to electrically insulate the collector housing 20 from the additional housing 38. Thus, the additional housing 38 serves to shield the collector housing 20, such that accurate and reliable measurement results could be achieved.

The apparatus 2 further comprises an outer housing 56, which is made of aluminium. The outer housing 56 surrounds a third chamber 58 in which the additional housing 38 is placed, i.e. the additional housing 38 together with the collector housing 20 surrounded by the additional housing 38 is placed within the outer housing 56. The third chamber 58 is limited in the longitudinal direction 10 by a front wall 60, in the longitudinal or feeding direction 8 by a back wall 62 and in the lateral and vertical directions 12, 14, 16, 18 by a surrounding side wall 63 of the outer housing 56.

In the front wall 60 of the outer housing 56 there is provided an opening 64, said opening 64 being dimensioned such that the domestic appliance 6 could at least partially, preferably completely, inserted into the collector housing 20 in the longitudinal or feeding direction 8 via opening 64, opening 48 and input opening 32 as will be described later. In order to achieve this, the width in the lateral direction 12, 14 and the height in the vertical direction 16, 18 of the opening 64 is at least 8 cm, preferably at least 12 cm, more preferably at least 16 cm. The opening 64 is also circular and provided in the front wall 60 such that a collar 66 of the front wall 60 is left, which surrounds the opening 64.

The opening 64 is aligned with the input opening 32 in the longitudinal or feeding direction 8 and has a smaller size, i.e. the height and width of the opening 64 and/or the diameter of the opening 64 is smaller than the height h and width of the input opening 32 and/or the diameter of the input opening 32. It is further preferred, if the opening 64 has a smaller size than the opening 48, i.e. the height and width of the opening 64 and/or the diameter of the opening 64 is smaller than the height and width of the opening 48 and/or the diameter of the input opening 48. Further, a projection z of the opening 64 in the longitudinal or feeding direction 8 is completely arranged within the projection x of the input opening 32 in the longitudinal or feeding direction 8, as indicated in FIG. 1. It is further preferred, if the projection z of the opening 64 in the longitudinal or feeding direction 8 is completely arranged within the projection y of the opening 48 in the longitudinal or feeding direction 8.

The size of the opening 64, e.g. its width or/and height or its diameter, in the outer housing 56 may be altered, i.e. the size may be enlarged or decreased. For this purpose a movable cover 68 is provided at the front wall 60 of the outer housing 56. In the shown embodiment, the cover 68 is a so-called iris diaphragm. It should further be mentioned that the cover 68 may alternatively or additionally provided at the additional housing 38, so that the size of the opening 48 could be altered, however, the cover 68 should in no case be electrically connected with the collector housing 20. In order to simplify the construction of the apparatus 2 as well as its handling, the movable cover 68 should be provided at the outer housing 56, as shown in the figures.

The outer housing 56 is grounded by way of a second conductor 70 to a ground 71, said ground 71 being separated from the reference ground 53 of the determining means 36. The second conductor 70 is separated from the first conductor 52 for grounding the additional housing 38. Further, there are provided insulating means 72 to avoid direct contact between the additional housing 38 and the outer housing 56 and to electrically insulate the additional housing 38 from the outer housing 56. Thus, the collector housing 20 is separated from the outer housing 56 by way of the insulating means 54 and the insulating means 72. It has been found out that by providing the outer housing 56 together with the additional housing 38 the shielding of the collector housing 20 from external influences could be considerably enhanced so that environmental aspects do no longer have an influence on the measurement results.

As can be seen from the figures, there is further provided an outlet opening 74 for releasing air from the inside of the collector housing 20, i.e. from its chamber 22, to the environment 76 of the apparatus 2. The outlet opening 74 is disposed on the opposite side of the input opening 32, i.e. the outlet opening 74 is provided within the back wall 26 of the collector housing 20 and thus separated from the input opening 32. Further, the outlet opening 74 is smaller than the input opening. Providing the outlet opening 74 is especially useful if the domestic appliance 6 generates heat or discharges heated air. This is for example the case, if the domestic appliance 6 is a curling iron or a hairdryer. The outlet opening 74 eliminates the interference factor of heated air retained inside the collector housing 20. In order to avoid that ions emitted by the domestic appliance 6 leave the collector housing 20 through the outlet opening 74, the outlet opening 74 is covered with an electroconductive mesh 77 connected to the collector housing 20 for collecting ions. Further, there are provided openings 78, 78 in the walls 62, 44 of the outer housing 56 and the additional housing 38 for leading the air from the outlet opening 74 to the environment 76 of the apparatus 2, said openings 78, 78 preferably being covered with an electroconductive mesh 79, 79 as well, each of said meshes 79, 79 being connected to the corresponding wall 62 and 44, respectively.

The apparatus further comprises a feeding system 80 for feeding the domestic appliance 6 into the collector housing 20. The feeding system 80 comprises a movable carrier 82 for carrying the domestic appliance 6. The movable carrier 82 may be moved in the longitudinal direction 8, 10 with respect to a base 84 of the feeding system 80 and the collector housing 20. The carrier 82 further comprises fixing means 86 for immobilizing the domestic appliance with respect to the carrier 82.

Hereinafter, the functionality of the apparatus 2 and a preferred embodiment of the method according to the invention will be described with reference to FIGS. 1 to 4.

The apparatus 2 and the method are especially useful, if the ion source 4 of the handheld domestic appliance 6 is a non-directional ion source, so that the ions are expelled in different directions and not uniformly in a predetermined direction in order to form an ion beam. In the present embodiment, the domestic appliance 6 is a hair care device. Even if the hair care device in FIGS. 1 to 4 is a hairbrush, it could also be another hair care device, e.g. a hairdryer or a curling iron.

Figure 2:
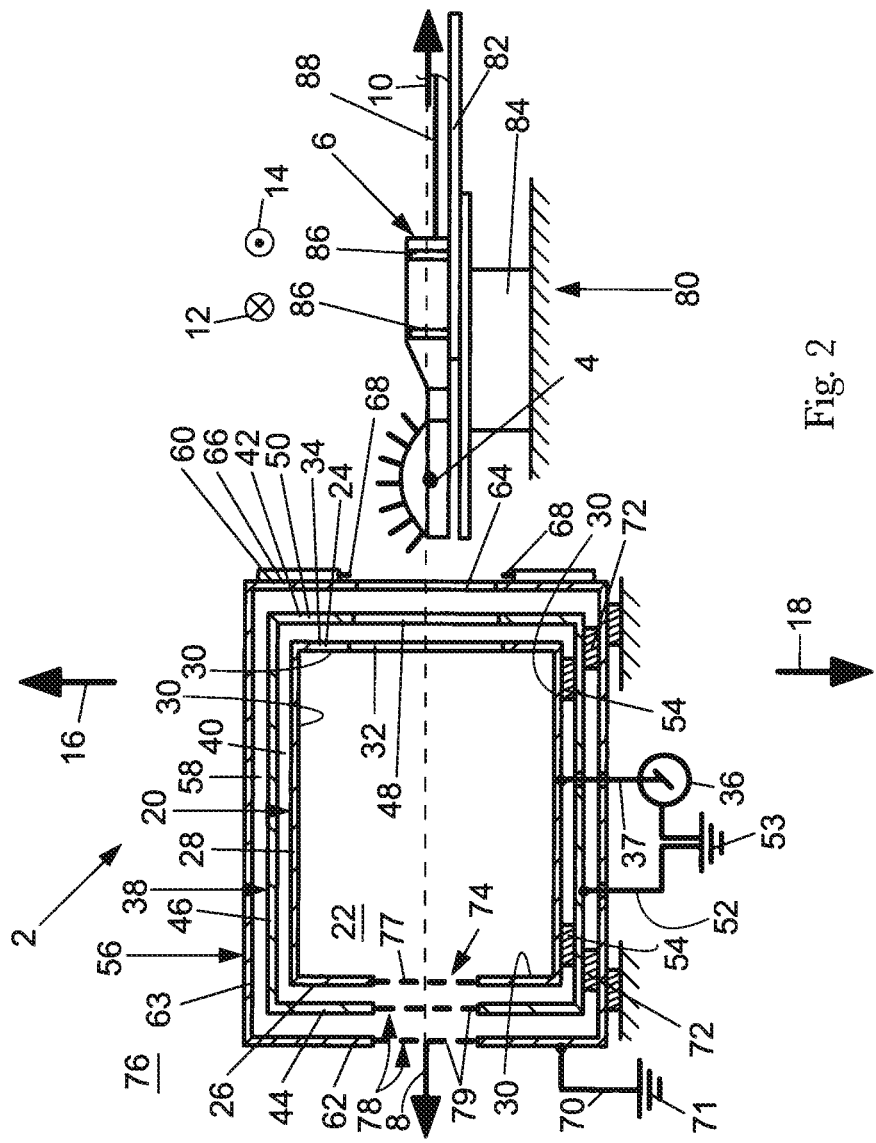
FIG. 2 shows the apparatus according to FIG. 1 after the domestic appliance has been fixed to the feeding system.
Figure 3:
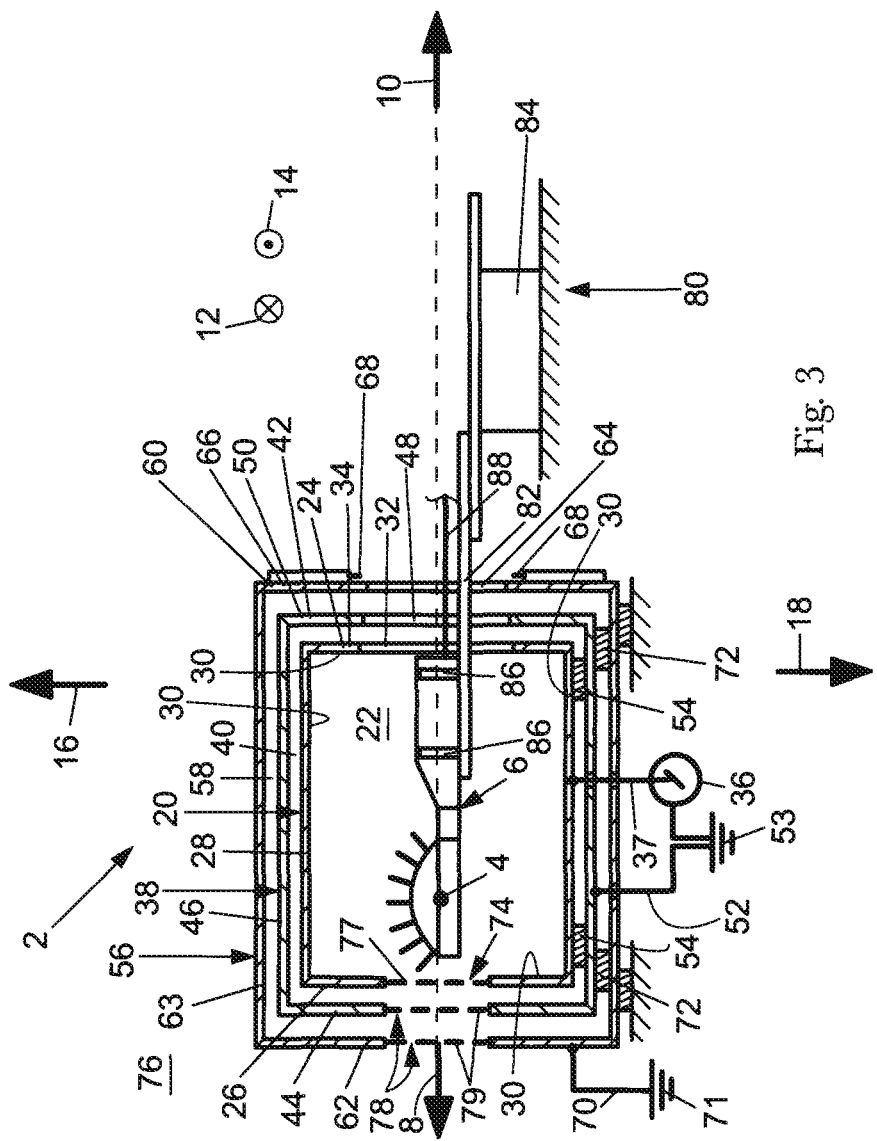
FIG. 3 shows the apparatus according to FIG. 2 after the domestic appliance has been inserted into the collector housing and FIG. 4 shows the apparatus according to FIG. 3 after the opening in the outer housing has been covered and during measuring.
Figure 4:
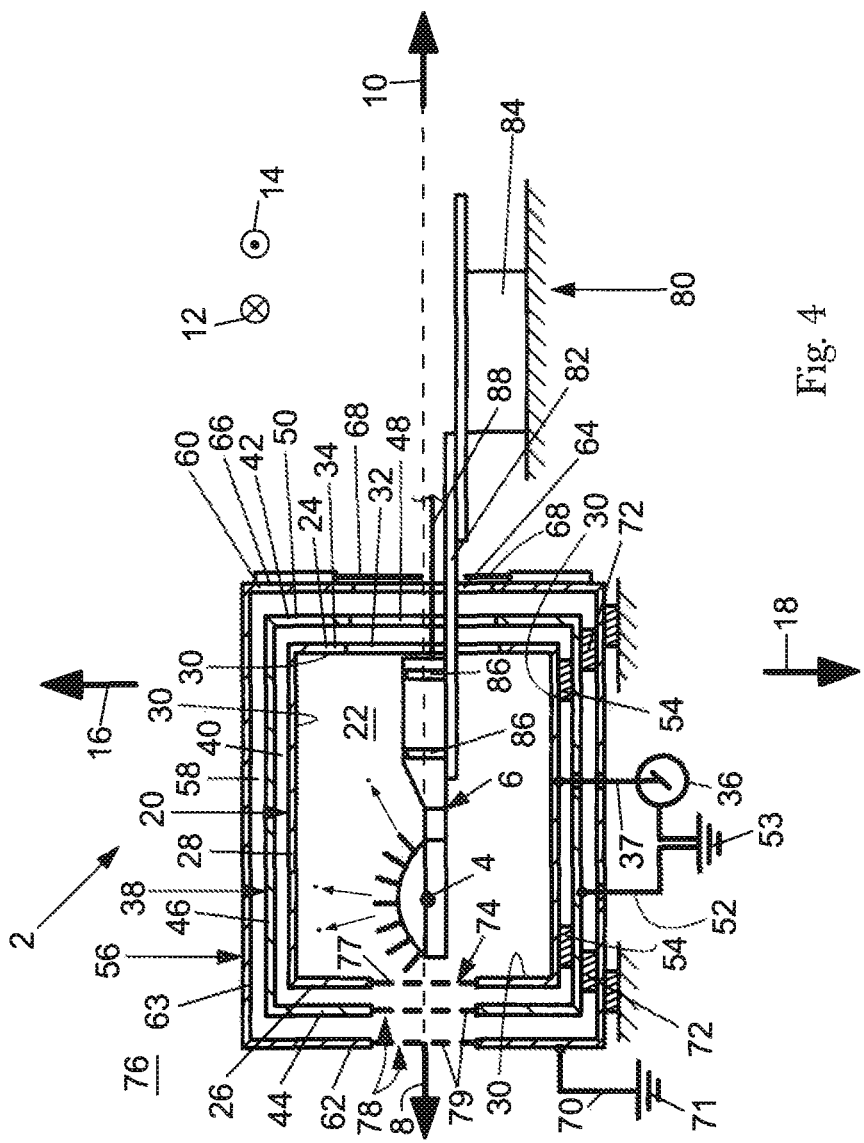

As can be seen in FIG. 2, the domestic appliance 2 is fixed to the carrier 82 of the feeding system 80 by way of the fixing means 86 first, so that the domestic appliance 6 is immobilized with respect to the carrier 82. Afterwards, the carrier 82 is moved in the longitudinal or feeding direction 8, so that the domestic appliance 6 fixed thereto is inserted completely into the collector housing 20 via opening 64, opening 48 and input opening 32 as can be seen in FIG. 3. After that, the opening 64 in the outer housing 56 is at least partially covered by way of the cover 68, so that the size of the opening 64 is altered and reduced, respectively, after the domestic appliance 6 has been inserted into the collector housing 20 (FIG. 4).

Then, the domestic appliance 6 is turned on, e.g. by plugging in the not shown plug of the power cord 88 of the domestic appliance 6, said power cord 88 being at least partially positioned outside the housings 20, 38 and 56. The non-directional ion source 4 expels ions which impinge on the inner surface 30 of the collector housing 20, while the determining means 36 determine the number of ions impinging on the inner surface 30 of the collector housing 20. During this procedural step, the air inside the chamber 22 of the collector housing 20, which is heated by the domestic appliance 6, is at least partially released to the environment 76 by means of the outlet opening 74 and the outlet conduit 78, respectively, in order to avoid the negative influence of heated air retained inside the collector housing 20.

Even if not explicitly shown in the figures, the conductor 70 via which the outer housing 56 is grounded, the conductor 52 via which the additional housing 38 is grounded and the conductor 37 connecting the collector housing 20 with the determining means 36 form a triaxial cable. In this triaxial cable the conductor 37 leading to the determining means 36 forms the inner conductor, the conductor 52 grounding the additional housing 38 forms the inner tubular conductor and the conductor 70 grounding the outer housing 56 forms the outer tubular conductor of the triaxial cable. With this triaxial cable a very accurate measuring could be carried out.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An apparatus for counting the number of ions emitted by an ion source of a handheld domestic appliance, said apparatus comprising a collector housing having an inner surface, said collector housing for collecting ions impinging on the inner surface of the collector housing, said collector housing having an input opening, wherein the input opening is dimensioned so that a domestic appliance is at least partially insertable into the collector housing via the input opening, and a determining means coupled with the collector housing in order to determine the number of ions collected by the collector housing.

2. An apparatus according to claim 1, wherein the input opening has a width and a height of at least about 8 cm.

3. An apparatus according to claim 1 wherein the collector housing surrounds a chamber, and said chamber has a feeding direction which has a length of at least about 35 cm.

4. An apparatus according to claim 1, wherein the collector housing is arranged within an outer housing, the outer housing being grounded and the collector housing being separated from the outer housing by insulating means.

5. An apparatus according to claim 4, wherein the collector housing is arranged within an additional housing, the additional housing being grounded and placed within the outer housing, wherein the collector housing as well as the outer housing are separated from the additional housing by insulating means.

6. An apparatus according to claim 5, wherein the collector housing and the additional housing are made of copper.

7. An apparatus according to claim 4, wherein at least one of the outer housing and the additional housing has an opening, wherein the opening is aligned with the input opening of the collector housing.

8. An apparatus according to claim 7, further comprising a cover for altering the size of the opening of at least one of the outer housing and the additional housing.

9. An apparatus according to claim 7, wherein a projection of the opening in the feeding direction is completely arranged within a projection of the input opening in the feeding direction.

10. An apparatus according to claim 1, wherein the collector housing further comprises an outlet opening for releasing air from the inside of the collector housing to the environment of the apparatus.

11. An apparatus according to claim 1, further comprising a feeding system for feeding the domestic appliance into the collector housing.

12. A method for counting the number of ions emitted by an ion source of a handheld domestic appliance comprising the steps of:

providing an apparatus for counting the number of ions emitted by an ion source of a handheld domestic appliance, said apparatus comprising a collector housing having an inner surface, said collector housing for collecting ions impinging on the inner surface of the collector housing, said collector housing having an input opening, wherein the input opening is dimensioned so that a domestic appliance is at least partially insertable into the collector housing via the input opening, and a determining means coupled with the collector housing in order to determine the number of ions collected by the collector housing:

inserting the domestic appliance at least partially into the collector housing; and determining the number of ions impinging on the inner surface of the collector housing.

13. A method according to claim 12 comprising a further step of at least partially covering the opening in the outer housing and/or the additional housing in order to alter the size of the opening after the domestic appliance has been inserted into the collector housing.

14. A method according to claim 12 comprising a further step of releasing air from the inside of the collector housing to the environment of the apparatus.

* * * * *